United States Patent
Kamiya et al.

(10) Patent No.: US 10,763,973 B2
(45) Date of Patent: Sep. 1, 2020

(54) PHASE NOISE COMPENSATION APPARATUS, DEMODULATION APPARATUS, COMMUNICATION APPARATUS, COMMUNICATION SYSTEM, AND PHASE NOISE COMPENSATION METHOD

(71) Applicant: NEC Corporation, Minato-ku, Tokyo (JP)

(72) Inventors: Norifumi Kamiya, Tokyo (JP); Eisaku Sasaki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/325,762

(22) PCT Filed: May 16, 2017

(86) PCT No.: PCT/JP2017/018310
§ 371 (c)(1),
(2) Date: Feb. 15, 2019

(87) PCT Pub. No.: WO2018/034030
PCT Pub. Date: Feb. 22, 2018

(65) Prior Publication Data
US 2019/0207683 A1 Jul. 4, 2019

(30) Foreign Application Priority Data
Aug. 17, 2016 (JP) .................. 2016-160081

(51) Int. Cl.
*H04B 10/61* (2013.01)
*H04L 27/38* (2006.01)
(Continued)

(52) U.S. Cl.
CPC ......... *H04B 10/6165* (2013.01); *G01R 29/26* (2013.01); *H04B 10/2941* (2013.01);
(Continued)

(58) Field of Classification Search
CPC .......... H04B 10/614; H04B 10/5165; H04B 10/615; H04B 10/64; H04B 10/675;
(Continued)

(56) References Cited

U.S. PATENT DOCUMENTS

| 7,031,405 | B1 * | 4/2006 | Touzni | ............... | H04L 27/0014 |
| | | | | | 375/233 |
| 7,167,535 | B2 * | 1/2007 | Sachse | ............... | H04L 27/0014 |
| | | | | | 375/354 |

(Continued)

FOREIGN PATENT DOCUMENTS

| JP | 2000-101666 A | 4/2000 |
| JP | 2002-94592 A | 3/2002 |

(Continued)

OTHER PUBLICATIONS

Cavers, et al., "An analysis of pilot symbol assisted modulation for Rayleigh fading channel", IEEE Transactions on Vehicular Technology, Nov. 1991, vol. 40, No. 4, pp. 686-693 (10 pages total).
(Continued)

*Primary Examiner* — Abbas H Alagheband

(57) ABSTRACT

A phase noise compensation apparatus is used for a demodulation apparatus for demodulating a transmission signal modulated by a modulation scheme that uses phase information for data identification. A phase detector detects a phase error of a reception pilot symbol sequence included in a reception symbol sequence. A first filter refers to the phase error detected in a time series manner and sequentially estimates first phase noise components. A second filter refers to the phase error detected in a reverse time series manner and sequentially estimates second phase noise components. The synthesis processing unit estimates a phase noise component of a reception symbol based on an estimated value of the first phase noise component, an estimated value of the second phase noise component, and the phase error. The
(Continued)

phase rotator rotates a phase of the reception symbol based on the estimated phase noise component of the reception symbol.

11 Claims, 8 Drawing Sheets

(51) Int. Cl.
    *G01R 29/26*     (2006.01)
    *H04B 10/294*     (2013.01)
    *H04L 25/02*     (2006.01)
    *H04L 27/26*     (2006.01)
    *H04B 10/516*     (2013.01)

(52) U.S. Cl.
    CPC .......... *H04L 25/0212* (2013.01); *H04L 27/38* (2013.01); *H04B 10/516* (2013.01); *H04B 10/6162* (2013.01); *H04L 27/2657* (2013.01); *H04L 27/2675* (2013.01)

(58) Field of Classification Search
    CPC .. H04B 2210/006; H04B 10/40; H04B 10/61; H04B 10/516; H04B 10/6165; H04B 10/6162; H04L 27/22; H04L 27/01; H04L 27/0014; H04L 7/0075; H04L 27/2675; H04L 27/2657
    USPC .......................................................... 398/208
    See application file for complete search history.

(56) References Cited

U.S. PATENT DOCUMENTS

| | | | | |
|---|---|---|---|---|
| 7,409,024 | B2* | 8/2008 | Ginesi | H04L 27/0014 375/362 |
| 7,529,321 | B1* | 5/2009 | Shiraishi | H04H 20/74 375/329 |
| 7,822,069 | B2* | 10/2010 | Medvedev | H04L 1/0045 370/338 |
| 7,899,340 | B1* | 3/2011 | Bontu | H04B 10/60 398/203 |
| 9,337,934 | B1* | 5/2016 | Agazzi | H04L 7/0075 |
| 10,277,440 | B1* | 4/2019 | Sethi | H04L 27/0014 |
| 2003/0112825 | A1* | 6/2003 | Wang | H04L 27/2675 370/491 |
| 2006/0064725 | A1* | 3/2006 | Rabinowitz | G01S 5/0036 725/68 |
| 2010/0309970 | A1* | 12/2010 | Meyer | H04L 27/0014 375/233 |
| 2011/0150478 | A1* | 6/2011 | Winzer | H04B 10/6971 398/65 |
| 2015/0098535 | A1* | 4/2015 | Wu | H04B 1/1027 375/350 |
| 2016/0330064 | A1* | 11/2016 | Kamiya | H04L 27/3872 |

FOREIGN PATENT DOCUMENTS

| | | |
|---|---|---|
| JP | 2011-101177 A | 5/2011 |
| WO | 2011/068119 A1 | 6/2011 |
| WO | 2013/161801 A1 | 10/2013 |
| WO | 2015/107897 A1 | 7/2015 |

OTHER PUBLICATIONS

Spalvieri, et al., "Pilot-aided carrier recovery in the presence of phase noise", IEEE Transactions on Communications, Jul. 2011, vol. 59, No. 7, pp. 1966-1974 (11 pages total).

Kamiya, et al., "Pilot-symbol assisted and code-aided phase error estimation for high-order QAM transmission", IEEE Transactions on Communications, Oct. 2013, vol. 61, No. 10, pp. 4396-4380 (14 pages total).

Simon, et al., "Phase noise estimation via adapted interpolation", IEEE Global Telecommunications Conference, Nov. 2001, pp. 3297-3301 (7 pages total).

International Search Report, issued by International Searching Authority in corresponding International Application No. PCT/JP2017/018310, dated Jul. 11, 2007.

* cited by examiner

PHASE NOISE COMPENSATION APPARATUS, DEMODULATION APPARATUS, COMMUNICATION APPARATUS, COMMUNICATION SYSTEM, AND PHASE NOISE COMPENSATION METHOD

This application is a National Stage Entry of PCT/JP2017/018310 filed on May 16, 2017, which claims priority from Japanese Patent Application 2016-160081 filed on Aug. 17, 2016, the contents of all of which are incorporated herein by reference, in their entirety.

TECHNICAL FIELD

The present disclosure relates to a phase noise compensation apparatus and method. Specifically, the present disclosure relates to a phase noise compensation apparatus and method used in a communication scheme for transmitting information using phase information.

The present disclosure also relates to a demodulation apparatus, a communication apparatus, and a communication system including the phase noise compensation apparatus.

BACKGROUND ART

In digital communication, a Quadrature Amplitude Modulation (QAM) scheme that uses both phase information and amplitude information to identify data is known as a modulation/demodulation scheme for efficient data transmission. Recently, an increase in a modulation multilevel number has been desired along with a demand for increasing a capacity of a communication system. However, there is a problem that when the modulation multilevel number is increased, a transmission error probability increases due to noise, thereby decreasing the noise immunity. In particular, in a transmission apparatus and a reception apparatus employing a modulation scheme such as the QAM scheme, phase noise mainly caused by a Local Oscillator (LO) becomes a factor to increase uncertainty of phase information and remarkably degrade a Bit Error Rate (BER).

For example, if a phase error occurs due to phase noise in a communication system using a multilevel QAM scheme having 256 or more signal points, the bit error rate increases, and the reliability of data communication decreases. In such a communication system, it is necessary to estimate the phase error caused by the phase noise with high accuracy and then compensate it in order to perform highly reliable data communication. Further, in a communication system using a multilevel QAM scheme or the like, it is necessary to improve tolerance to errors caused by factors other than the phase noise such as thermal noise.

As a demodulation apparatus that can improve error tolerance, a demodulation apparatus that includes a QAM symbol demapping apparatus which performs phase error compensation using a Phase Lock Loop (PLL) and outputs a bit sequence reflecting likelihood information at a subsequent stage of the PLL, and an error correction decoder which inputs likelihood information and performs error correction processing is known. An example of the QAM symbol demapping apparatus is disclosed in, for example, Patent Literature 1.

However, in the above demodulation apparatus, a sufficiently and satisfactory bit error rate characteristic may not be achieved because of a magnitude of the phase noise included in a baseband signal output from a detector or deteriorated accuracy of phase detection due to thermal noise etc. In order to address this problem, Patent Literature 2 and 3 discloses a technique for improving the accuracy of phase error compensation by adaptively adjusting a bandwidth of a loop filter in a phase lock loop.

In addition to the above-described method of using the phase lock loop, a method of periodically embedding a known signal (a pilot signal) in a transmission signal and compensating the phase noise using this known signal is known. A general principle related to improvement of communication reliability using a pilot signal is described in, for example, Non Patent Literature 1. A method of using the pilot signal to improve the accuracy of the phase noise compensation method is described in, for example, Non Patent Literature 2, 3, and 4.

FIG. 10 is a block diagram showing a configuration example of a phase noise compensation apparatus which compensates phase noise using a pilot signal. Referring to FIG. 10, a phase noise compensation apparatus 200 includes a FIFO (First-In First-Out) memory 201, a phase detector 202, an interpolation filter 203, a phase rotator 204, and a switch 205.

In the phase noise compensation apparatus 200, a reception symbol corresponding to a reception baseband signal is input to the FIFO memory 201. When the reception symbol is a pilot symbol corresponding to a known pilot signal inserted at a transmission side, the reception symbol is also input to the phase detector 202 through the switch 205. The phase detector 202 detects a phase component of the reception pilot symbol and outputs it to the interpolation filter 203.

The interpolation filter 203 includes a selector 206, a register 207, a multiplier 208, and a tap coefficient update apparatus 209. The interpolation filter 203 performs weighted interpolation processing on a plurality of reception pilot symbols and estimates phase noise in the reception symbol between the pilot symbols. The phase rotator 204 rotates a phase of the reception symbol based on phase information output by the interpolation filter 203 to compensate the phase noise in the reception symbol. A phase noise compensation method using such a pilot signal is disclosed in, for example, Patent Literature 4.

CITATION LIST

Patent Literature

Patent Literature 1: International Patent Publication No. WO2011/068119
Patent Literature 2: Japanese Unexamined Patent Application Publication No. 2000-101666
Patent Literature 3: Japanese Unexamined Patent Application Publication No. 2011-101177
Patent Literature 4: International Patent Publication No. WO2013/161801

Non Patent Literature

Non Patent Literature 1: J. Cavers, "An analysis of pilot symbol assisted modulation for Rayleigh fading channel," IEEE Transactions on Vehicular Technology, vol.40, no.4, pp.686-693, November 1991.
Non Patent Literature 2: A. Spalvieri and L. Barletta, "Pilot-aided carrier recovery in the presence of phase noise," IEEE Transactions on Communications, vol.59, no.7, pp.1966-1974, July 2011.

Non Patent Literature 3: N. Kamiya and E. Sasaki, "Pilot-symbol assisted and code-aided phase error estimation for high-order QAM transmission," IEEE Transactions on Communications, vol.61, no.10, pp.4396-4380, October 2013.

Non Patent Literature 4: V. Simon, A. Senst, M. Speth and H. Meyr, "Phase noise estimation through adapted interpolation," IEEE Global Telecommunications Conference (Globecom), Proceedings, pp.3297-3301, November 2001.

SUMMARY OF INVENTION

Technical Problem

Recently, there has been a growing demand for increasing a capacity of a wireless communication system, and an expansion of the modulation multilevel number has been required, which poses a problem about compensation of phase noise in an LO signal that greatly affects a transmission characteristic. The effect of phase noise compensation using carrier wave reproduction PLL according to the related art is limited regarding this problem. For example, when a level of the phase noise included in the baseband signal output by the detector is larger than a signal multilevel number of the QAM scheme, a sufficient BER characteristic cannot be achieved, and large-capacity and high-quality data communication becomes difficult.

On the other hand, the phase noise compensation apparatus using a pilot signal can compensate the phase noise with high accuracy. However, the phase noise compensation apparatus using a pilot signal has a problem in a trade-off between compensation accuracy and an apparatus size and a calculation amount. In order to improve the compensation accuracy, it is necessary to increase the number of taps of the interpolation filter 203. An increase in the number of taps involves an increase in the selector 206, the register 207, the multiplier 208, and the tap coefficient update apparatus 209, thereby increasing the apparatus size and the calculation amount. In particular, the tap coefficient update apparatus 209 includes a register, a multiplier, and an adder, and thus an increase of the tap coefficient update apparatus 209 greatly affects the increase in the apparatus size. A large number of taps are required in order to perform highly accurate phase noise compensation under a transmission condition with a low Carrier-to-Noise Ratio (C/N ratio), which increases an apparatus size of the interpolation filter compared with the case where a phase lock loop is used.

In view of the above circumstances, an object of the present disclosure is to provide a phase noise compensation apparatus and method capable of compensating phase noise with high accuracy without requiring a large increase in a calculation amount and an apparatus size.

Solution to Problem

In order to address the above problem, the present disclosure provides a phase noise compensation apparatus used for a demodulation apparatus for demodulating a transmission signal modulated by a modulation scheme that uses phase information for data identification. The phase noise compensation apparatus includes: a phase detector configured to section reception symbols including a reception data symbol and a reception pilot symbol included in the transmission signal into a block of predetermined number of symbols and detect a phase error of a reception pilot symbol sequence obtained by extracting the reception pilot symbol included in the sectioned reception symbol sequence; a first filter including an infinite impulse response filter configured to refer to the phase error in order in a time series manner and sequentially estimate a first phase noise component of the reception pilot symbol; a second filter including an infinite impulse response filter configured to refer to the phase error in order in a reverse time series manner and sequentially estimate a second phase noise component of the reception pilot symbol; synthesis processing means for estimating a phase noise component of the reception symbol included in the reception symbol sequence based on the first phase noise component, the second phase noise component, and the phase error; and a phase rotator configured to rotate a phase of the reception symbol based on the estimated phase noise component of the reception symbol.

The present disclosure further provides a demodulation apparatus including: the above phase noise compensation apparatus; a local oscillator configured to output a signal having a predetermined frequency; and a detector configured to detect the transmission signal using the signal output from the local oscillator and output it to the phase noise compensation apparatus.

The present disclosure further provides a reception apparatus including: the above demodulation apparatus; and a reception circuit configured to receive the transmission signal and supply it to the demodulation apparatus.

The present disclosure further provides a communication system including: the above reception apparatus; a modulation apparatus configured to modulate transmission data and output a modulated signal to the reception apparatus; and a transmission apparatus including a transmission circuit that transmits the modulated signal to the reception apparatus.

The present disclosure further provides a phase noise compensation method including: sectioning a reception symbol sequence including a data symbol and a pilot symbol included in a transmission signal modulated by a modulation scheme that uses phase information for data identification into a block of a predetermined number of symbols and detecting a phase error of a reception pilot symbol sequence obtained by extracting the reception pilot symbol included in the sectioned reception symbol sequence; referring to the phase error in order in a time series manner and sequentially estimating a first phase noise component of the reception pilot symbol using an infinite impulse response filter; referring to the phase error in order in a reverse time series manner and sequentially estimating a second phase noise component of the reception pilot symbol using an infinite impulse response filter; estimating a phase noise component of a reception symbol included in the reception symbol sequence based on the first phase noise component, the second phase noise component, and the phase error; and rotating a phase of the reception symbol based on the estimated phase noise component of the reception symbol.

Advantageous Effects of Invention

The phase noise compensation apparatus, the demodulation apparatus, the communication apparatus, the communication system, and the phase noise compensation method according to the present disclosure can compensate phase noise with high accuracy without requiring a large increase in a calculation amount and an apparatus size.

DESCRIPTION OF EMBODIMENTS

Figure 1:
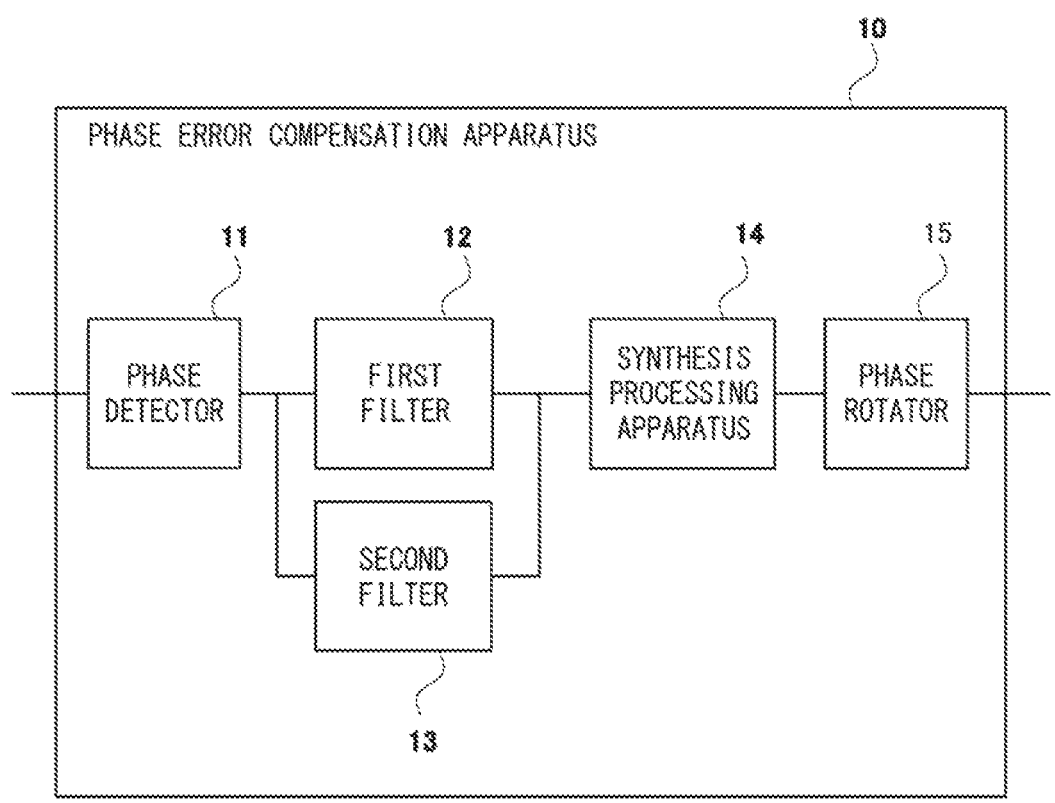
FIG. 1 is a block diagram showing a phase noise compensation apparatus according to the present disclosure.

An outline of the present disclosure will be described prior to describing an embodiment according to the present disclosure. FIG. 1 shows a phase noise compensation apparatus according to the present disclosure. A phase noise compensation apparatus 10 includes a phase detector 11, a first filter 12, a second filter 13, a synthesis processing unit (synthesis processing means) 14, and a phase rotator 15.

The phase noise compensation apparatus 10 is used in a demodulation apparatus that demodulates a transmission signal modulated by a modulation scheme that uses phase information for data identification. The transmission signal includes data symbols and pilot symbols. The phase detector 11 sections reception symbols included in the transmission signal into a block of a predetermined number of symbols and detects a phase error of a reception pilot symbol sequence which is obtained by extracting reception pilot symbols included in a sectioned reception symbol sequence.

The first filter 12 and the second filter 13 each include an infinite impulse response filter. The first filter 12 refers to a phase error detected by the phase detector 11 in a time series manner and sequentially estimates first phase noise components of the reception pilot symbols. The second filter 13 refers to the phase error in a reverse time series manner and sequentially estimates second phase noise components of the reception pilot symbols. The time series here indicates a time sequence in a temporal direction in which the time passes from the past to the present, whereas the reverse time series means a time sequence in a direction on a time axis opposite to the time series. The first filter 12 and the second filter 13 refer to the phase errors in directions on the time axis opposite to each other and estimate the phase noise components.

The synthesis processing unit 14 estimates a phase noise component of the reception symbol included in the reception symbol sequence based on the first phase noise component estimated by the first filter 12, the second phase noise component estimated by the second filter 13, and the phase error of the reception pilot symbol. The phase rotator 15 rotates a phase of the reception symbol based on the phase noise component of the reception symbol estimated by the synthesis processing unit 14.

Here, the phase noise has a time correlation, and when an attempt is made to estimate the phase noise at a certain point of time, the phase noise can be estimated by making an estimation in a time series manner using past observation values before the point of time. Additionally, phase noise at the same point of time can be estimated in a reverse time series manner using observation values preceding the point of time. In the present disclosure, the phase noise component is estimated in a time series manner using the first filter, and the phase noise component is estimated in a reverse time series manner using the second filter. It can be considered that by using these two estimation results, estimation accuracy higher than when only one estimation result is used can be achieved. Further, in the present disclosure, an infinite impulse response filter is used for the first filter and the second filter, which makes it possible to estimate the phase noise component with high accuracy without requiring a large increase in the calculation amount and the apparatus size.

Hereinafter, an embodiment according to the present disclosure will be described in detail with reference to the drawings. However, the components described in the following embodiments are merely examples, and the technical scope of the present disclosure is not limited to them.

Figure 2:
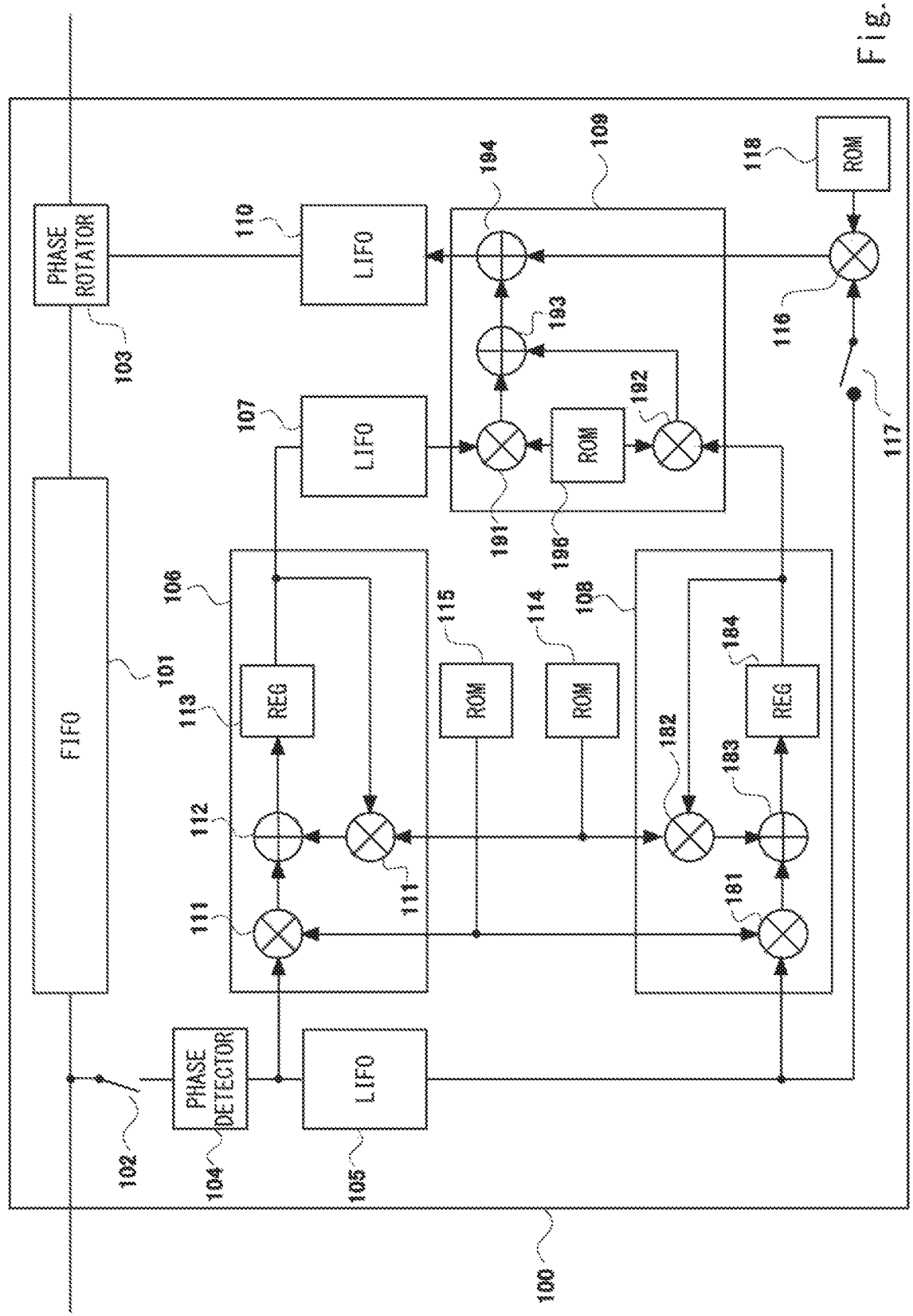
FIG. 2 is a block diagram showing a configuration of the phase noise compensation apparatus according to an embodiment of the present disclosure.

FIG. 2 shows a phase noise compensation apparatus according to the embodiment of the present disclosure. A phase noise compensation apparatus 100 includes an FIFO (First-In First-Out) memory 101, a phase rotator 103, a phase detector 104, an LIFO (Last-In First-Out) memory 105, an Infinite Impulse Response (IIR) filter 106, an IIR filter 108, and a synthesis processing unit 109. The phase noise compensation apparatus 100 compensates degradation of a transmission signal caused by phase noise and/or thermal noise generated in a local oscillator.

The phase noise compensation apparatus 100 according to the present embodiment is used in a signal reception apparatus in a communication system that performs communication using a modulation scheme that uses phase information for data identification. The communication system may be a wireless communication system that transmits and receives radio signals or may be an optical communication system that transmits and receives optical signals. In the following descriptions, the case in which the modulation scheme is QAM (Quadrature Amplitude Modulation) will be mainly described, but the modulation scheme is not limited to QAM. The modulation scheme may be other modulation schemes that use phase information for data identification such as a PSK (Phase Shift Keying) scheme or an APSK (Amplitude and phase-shift keying) scheme.

The phase noise compensation apparatus 100 is implemented by hardware such as LSI (Large-Scale Integration). The phase noise compensation apparatus 100 may be configured as a part of an LSI that implements a signal reception apparatus or another circuit part included in the LSI, for example, as a part of an LSI that implements a demodulation apparatus or the like. At least a part of the processing performed by the phase noise compensation apparatus 100 may be carried out by software processing using a processor.

In the phase noise compensation apparatus 100, a reception symbol corresponding to a reception baseband signal is input to the FIFO memory 101. The FIFO memory 101 stores a reception symbol sequence obtained by sectioning the reception symbols into a block of a predetermined number of symbols. The FIFO memory 101 outputs each reception symbol included in the stored reception symbol sequence in a time series manner.

In the phase noise compensation apparatus 100, a control circuit (not shown) closes the switch 102 only during a time slot of a reception pilot symbol corresponding to a known pilot signal inserted in a transmission signal on a transmission side. A reception pilot symbol sequence composed of the reception pilot symbols included in the reception symbol sequence is input to the phase detector 104 through the switch 102. The phase detector 104 detects a phase component (a phase error) of each reception pilot symbol included in the reception pilot sequence. The phase detector 104 outputs the detected phase error to the LIFO memory 105 and the first IIR filter 106. The phase detector 104 corresponds to the phase detector 11 in FIG. 1.

The first IIR filter 106 is configured as an infinite impulse response filter having two taps. The first IIR filter 106 refers to the phase error detected by the phase detector 104 in a time series manner and sequentially estimates first phase noise components of the reception pilot symbols. The first IIR filter 106 corresponds to the first filter 12 in FIG. 1.

The first IIR filter 106 includes multipliers 161 and 162, an adder 163, and a register 164. The multiplier 161 multiplies the phase error detected by the phase detector 104 by a predetermined coefficient (a tap coefficient) stored in a ROM (Read Only Memory) 115. The register 164 is a delay element. The multiplier 162 multiplies an output of the register 164 by a predetermined coefficient (a tap coefficient) stored in the ROM 114. The adder 163 adds an output of the multiplier 161 and an output of the multiplier 162. An output of the adder 163 is stored in the register 164. The data stored in the register 164 corresponds to the first phase noise component estimated by the first IIR filter 106. The first IIR filter 106 outputs the first phase noise component from the register 164.

The LIFO memory 105 stores the phase error detected by the phase detector 104. When the LIFO memory 105 stores the phase error of each reception pilot symbol included in the reception pilot symbol sequence, it outputs the phase error of each reception pilot symbol to the second IIR filter 108 in a reverse order of an input order. The LIFO memory 105 outputs the phase error of each reception pilot symbol also to the synthesis processing unit 109 through the switch 117 and the multiplier 116. The multiplier 116 multiplies the phase error of the reception pilot symbol input from the LIFO memory 105 through the switch 117 by a predetermined coefficient stored in the ROM 118 and outputs it to the synthesis processing unit 109.

The second IIR filter 108 is configured as an infinite impulse response filter having two taps. The second IIR filter 108 refers to the phase error detected by the phase detector 104 in a reverse time series manner, and sequentially estimates second phase noise components of the reception pilot symbols. When the second IIR filter 108 refers to the phase error in a reverse time series manner, it may use a value calculated using the first phase noise component, which is estimated by the first IIR filter 106, as an initial value. The second IIR filter 108 corresponds to the second filter 13 in FIG. 1.

The second IIR filter 108 includes multipliers 181 and 182, an adder 183, and a register 184. The multiplier 181 multiplies a predetermined coefficient stored in the ROM 115 by the phase error input through the LIFO memory 105. The register 184 is a delay element. The multiplier 182 multiplies an output of the register 184 by a predetermined coefficient stored in the ROM 114. The adder 183 adds an output of the multiplier 181 and an output of the multiplier 182. An output of the adder 183 is stored in the register 184. The data stored in the register 184 corresponds to the second phase noise component estimated by the second IIR filter 108. The second IIR filter 108 outputs the second phase noise component from the register 184.

The first IIR filter 106 outputs the first phase noise component of the reception pilot symbol sequentially estimated in a time series manner to the LIFO memory 107. The LIFO 107 memory outputs the first phase noise component input from the first IIR filter 106 to the synthesis processing unit 109 in the reverse order to the input order. The second IIR filter 108 outputs the second phase noise components of the reception pilot symbols sequentially estimated in a reverse time series manner to the synthesis processing unit 109. The phase error of the reception pilot multiplied by the predetermined coefficient output from the LIFO memory 105 and stored in the ROM 118 by the multiplier 116 is also input to the synthesis processing unit 109.

The synthesis processing unit 109 estimates the phase noise component of each reception symbol included in the reception symbol sequence based on an estimated value of the first phase noise component estimated by the first IIR filter 106, an estimated value of the second phase noise component estimated by the second IIR filter 108, and the phase error detected by the phase detector 104. The synthesis processing unit 109 estimates the phase noise component of each data symbol included in the reception symbol sequence based on, for example, the estimated first phase noise component and second phase noise component. The synthesis processing unit 109 also estimates the phase noise component of the pilot symbol included in the reception symbol sequence based on the estimated first phase noise component and second phase noise component and the phase error of the reception pilot symbol. The synthesis processing unit 109 corresponds to the synthesis processing unit 14 in FIG. 1.

The synthesis processing unit 109 includes multipliers 191 and 192, adders 193 and 194, and a ROM 196. The multiplier 191 multiplies the output (the estimated first phase noise component) of the first IIR filter 106 input through the LIFO memory 107 by a predetermined coefficient stored in the ROM 196. The multiplier 192 multiplies the output (the estimated second phase noise component) of the second IIR filter 108 by a predetermined coefficient stored in the ROM 196. The adder 193 adds an output of the multiplier 191 and an output of the multiplier 192. In other words, the adder 193 weights and adds the first phase noise component and the second phase noise component with the coefficients (weights) stored in the ROM 196.

The adder 194 adds an output of the adder 193 and the phase error multiplied by the predetermined coefficient in the multiplier 116. In other words, the adder 194 weights and adds a result of the weighted addition of the first phase noise component and the second phase noise component with the phase error detected by the phase detector 104. An output of the adder 194 corresponds to the phase noise component estimated by the synthesis processing unit 109. The predetermined coefficients stored in the ROMs 115, 114, 118, and 196 are determined based on a phase noise spectrum of the local oscillator used to demodulate the transmission signal. A specific example of the predetermined coefficients will be described later.

The synthesis processing unit 109 outputs the estimated phase noise component to the LIFO memory 110. The LIFO memory 110 outputs the phase noise component input from the synthesis processing unit 109 to the phase rotator 103 in the reverse order to the input order. The phase rotator 103 rotates the phase of the reception symbol output from the FIFO memory 101 by an amount corresponding to output data of the LIFO memory 110. The phase rotator 103 compensates the phase noise by rotating the phase of each reception symbol in a direction that cancels the phase noise component estimated by the synthesis processing unit 109. The phase rotator 103 corresponds to the phase rotator 15 in FIG. 1.

In the present embodiment, the FIFO memory and LIFO memories are used to control the order of reference and calculation etc. The configuration shown in FIG. 2 is an example, and the arrangement of the FIFO memory and the LIFO memories is not limited to that shown in FIG. 2. Instead of using the FIFO memory, the LIFO memories etc., the order of reference and calculation may be controlled in such a way that the reception symbol sequence, the detection result of the phase error, and the estimation result of the phase noise components are stored in normal memories, and the stored data is read in a specified order by each unit.

Further, in the present embodiment, although an example in which each coefficient is stored in the ROM has been described, the present disclosure is not limited to this. Each coefficient may be stored in any type of storage device and is not limited to being stored in a particular type of storage device.

Figure 3:
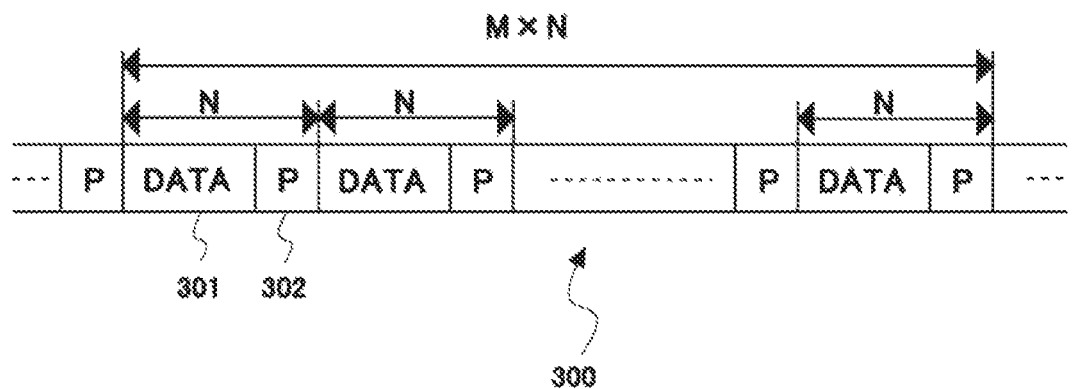
FIG. 3 is a block diagram showing an example of a transmission frame structure.

FIG. 3 shows an example of a transmission frame. A transmission frame 300 is composed of data symbols 301 and pilot symbols 302. In the transmission frame 300, the pilot symbols 302 are arranged, for example, at regular intervals of N symbols, where N is a positive integer. The transmission frame 300 is sectioned into a block of, for example, every MN reception symbols, where M is a positive integer. The MN sectioned reception symbols include M pilot symbols 302. The phase noise compensation apparatus 100 performs phase noise estimation and phase noise compensation in units of MN reception symbols.

In FIG. 3, although the pilot symbols are arranged at regular intervals in the reception symbols, the present disclosure is not limited to this. The pilot symbols may be arranged in any way, and the pilot symbols are not necessarily arranged at regular intervals. Hereinafter, an example in which the pilot symbols are arranged at regular intervals will be described for the convenience of descriptions.

In the phase noise compensation apparatus 100, for example, the transmission frame 300 composed of MN reception symbols including the data symbols 301 and the pilot symbols 302 is input. An example of the transmission frame 300 is shown in FIG. 3. Hereinafter, the reception symbols are denoted by r(1), r(2), . . . , and r(MN), and transmission symbols corresponding to the reception symbols are denoted by s(1), s(2), . . . , and s(MN). Further, phase noise caused by the local oscillator in each reception symbol is denoted by θ(1), θ(2), . . . , and θ(MN), and noise components caused by thermal noise are denoted by w(1), w(2), . . . , and w(MN). When n is an integer more than or equal to 1 and less than or equal to MN, the reception symbol r(n) can be expressed by the following equation.

$$r(n)=s(n)e^{j\theta(n)}+w(n)$$

Figure 4:
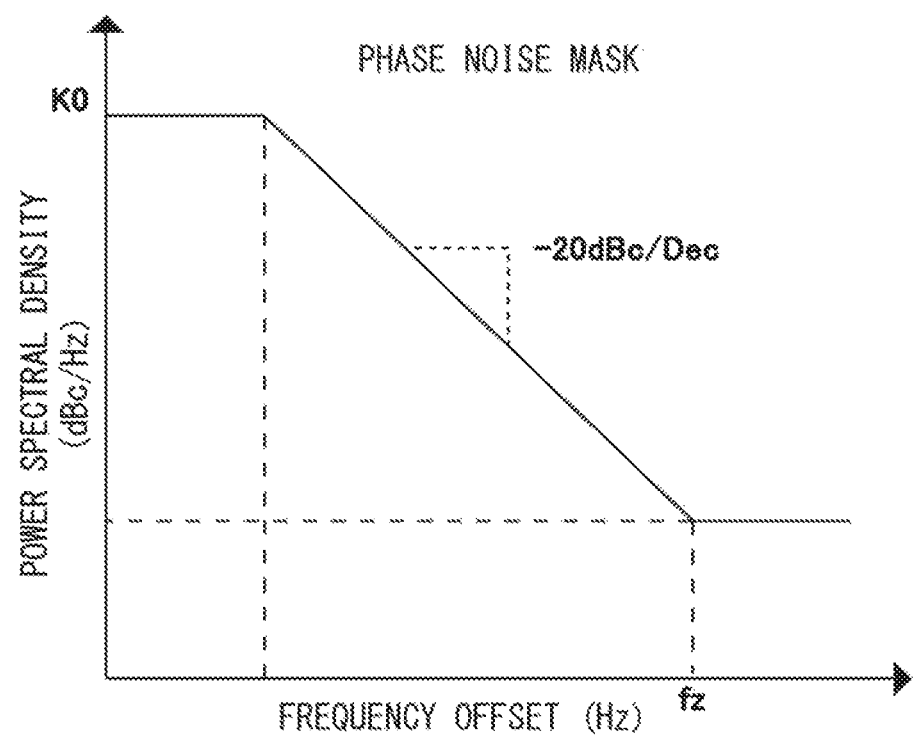
FIG. 4 is a view showing an example of a phase noise spectrum of a local oscillator.

In the above equation, e represents the Napier's constant and j represents an imaginary unit. It is assumed that the thermal noise w(n) is white noise with an average of 0 and a variance of $\sigma^2$. The thermal noise has a flat spectrum. On the other hand, the phase noise has a non-flat spectrum. FIG. 4 shows an example of a phase noise spectrum. In the example shown in FIG. 4, the phase noise spectrum is constant at a frequency lower than or equal to the frequency $f_p$ (Hz) and at a frequency higher than or equal to $f_z$ (Hz), and a section between $f_p$ and $f_z$ has a gradient of −20 dBc/dec. The power spectral density at a frequency 0 (Hz) is $K_0$. An example of a case where the phase noise has a spectrum shown in FIG. 4 will be described below.

Among the MN transmission symbols transmitted from the transmission side, M transmission symbols s(N), s(2N), . . . , and s(MN) are transmission pilot symbols defined in advance and corresponding to pilot signals known at the reception side. Suppose that power P of the pilot signal matches an average value of transmission symbol power. Among the MN reception symbols input to the phase noise compensation apparatus 100, reception symbols r(N), r(2N), . . . , and r(MN) are the reception pilot symbols corresponding to the pilot signal.

The phase noise compensation apparatus 100 receives the input reception symbols r(1), r(2), . . . , r(MN) and sequentially stores them in the FIFO memory 101. The M reception pilot symbols r(N), r(2 N), . . . , and r(MN) among the MN reception symbols are input to the phase detector 104 through the switch 102. When k is an integer more than or equal to 1 and less than or equal to M, the phase detector 104 calculates a phase difference (a phase error) between each reception pilot symbol r(kN) and a known transmission pilot symbol s(kN). More specifically, the phase detector 104 calculates a phase difference φ(kN) between the reception pilot symbol r(kN) and the transmission pilot symbol s(kN) using the equation below, where arg(z) is a function representing an argument of a complex number z.

$$\varphi(kN)=\arg(r(kN)/s(kN))$$

The phase difference φ(kN) calculated by the above equation can be expressed by the following equation using the phase noise θ(kN) of the reception pilot symbol and random noise $w^\theta(kN)$ caused by heat.

$$\varphi(kN)=\theta(kN)+w_\theta(kN)$$

In this equation, $w^\theta(kN)$ is a random sequence with an average of 0 and a variance of $\sigma_\theta^2$. The $\sigma_\theta^2$ can be expressed as $\sigma_\theta^2=\sigma^2/(2P)$ using the above-mentioned noise variance $\sigma^2$ of the thermal noise and the average signal power P. The phase noise compensation apparatus 100 estimates the phase noise θ(1), θ(2), . . . , and θ(MN) of the MN reception symbols from the M phase differences φ(N), φ(2N), . . . , and φ(MN) detected by the phase detector 104.

The phase detector 104 outputs the M phase differences φ(N), φ(2N), . . . , and φ(MN) to the first IIR filter 106 and the LIFO memory 105. After the input of the phase differences φ(N), φ(2 N), . . . , and φ(MN) to the LIFO memory 105 is completed, the LIFO memory 105 outputs the stored phase differences to the second IIR filter 108 in the order of φ(MN), φ((M−1)N), . . . , and φ(N). The presence of the LIFO memory 105 between the phase detector 104 and the second IIR filter 108 makes it possible for the first IIR filter 106 and the second IIR filter 108 to refer to the phase differences φ(N), φ(2N), . . . , and φ(MN) in reverse order to each other. Hereinafter, the first phase noise component estimated by the first IIR filter 106 is represented by θ⁺, and the second phase noise component estimated by the second IIR filter 108 is represented by θ⁻.

As described above, the first IIR filter 106 includes two multipliers 161 and 162, one adder 163, and one register 164. The first IIR filter 106 estimates the first phase noise component and then outputs the estimated value θ⁺ thereof. More specifically, the first IIR filter 106 calculates an estimated value θ⁺((k+1)N) of the first phase noise component of the k+1th reception pilot symbol using an estimated value θ⁺(kN) of the first phase noise component of the kth reception pilot symbol and the phase difference φ(kN).

Specifically, the first IIR filter 106 sequentially performs the calculation of the following equation to sequentially calculate the estimated values $\theta^+(N)$, $\theta^+(2N)$, ..., $\theta^+(MN)$, and $\theta^+((M+1)N)$ of the first phase noise components of the reception pilot symbols.

$$\theta^+((k+1)N) \leftarrow p_1\theta^+(kN)+p_2\varphi(kN), k=1, 2, \ldots, M$$

In this equation, $\theta^+(N)$ is an initial value of the register 164. Further, $p_1$ is a tap coefficient stored in the ROM 114, and $p_2$ is a tap coefficient stored in the ROM 115. Further, $p_1$ and $p_2$ are determined based on the phase noise spectrum, a pilot symbol interval N, the noise variance $\sigma_\theta^2$, and the like, which will be described later.

The first IIR filter 106 outputs the estimated values $\theta^+(N)$, $\theta^+(2N)$, ..., and $\theta^+(MN)$ of the first to Mth reception pilot symbols to the LIFO memory 107. The estimated value $\theta^+((M+1)N)$ of the first phase noise of the M+1th reception pilot symbol calculated by the first IIR filter 106 is an initial value of the register 164 in the processing of the next frame.

Although not shown in FIG. 2 in order to make the drawing simple, the estimated value $\theta^+((M+1)N)$ of the phase noise of the M+1th reception pilot symbol is supplied to the second IIR filter 108 and is used to calculate the initial value in the second IIR filter 108. Specifically, the initial value $\theta^-(MN)$ of the second IIR filter 108 is calculated by the following equation using the estimated value $\theta^+((M+1)N)$ of the first phase noise.

$$\theta^-(MN) \leftarrow p_3\theta^+((M+1)N)$$

In this equation, $p_3$ is a coefficient determined based on the phase noise spectrum, the pilot symbol interval N, the noise variance $\sigma_\theta^2$, and the like in a manner similar to the above $p_1$ and $p_2$.

Like the first IIR filter 106, the second IIR filter 108 includes two multipliers 181 and 182, one adder 183, and one register 184. The second IIR filter 108 estimates the second phase noise component and outputs an estimated value $\theta^-$ thereof. More specifically, the second IIR filter 108 uses the estimated value $\theta^-(kN)$ of the second phase noise component of the kth reception pilot symbol and the phase difference $\varphi(kN)$ to calculate an estimated value $\theta^-((k-1)N)$ of the second phase noise component of the k-1th reception pilot symbol.

Specifically, the second IIR filter 108 sequentially performs the calculation shown in the following equation to sequentially calculate the estimated values $\theta^-(MN)$, $\theta^+((M-1)N)$, ..., $\theta^+(N)$, and $\theta^+(0)$ of the second phase noise components of the reception pilot symbols.

$$\theta^-((k-1)N) \leftarrow p_1\theta^-(kN)+p_2\varphi(kN), k=M, M-1, \ldots, 1$$

The LIFO memory 107 outputs the estimated values $\theta^+(N)$, $\theta^+(2N)$, ..., and $\theta^+(MN)$ of the first phase noise components output from the first IIR filter 106 to the synthesis processing unit 109 in the reverse order to the input order. That is, the LIFO memory 107 sequentially outputs the estimated values $\theta^+(MN)$, $\theta^+((M-1)N)$, ..., and $\theta^+(N)$ of the first phase noise components. The second IIR filter 108 sequentially outputs the estimated values $\theta^-(MN)$, $\theta^+((M-1)N)$, ..., $\theta^+(N)$, and $\theta^+(0)$ of the second phase noise components to the synthesis processing unit 109. The LIFO memory 105 sequentially outputs the phase differences $\varphi(MN)$, $\varphi((M-1)N)$, ..., and $\varphi(N)$ to the synthesis processing unit 109 through the switch 117 and the multiplier 116.

The synthesis processing unit 109 estimates the phase noise component of each reception symbol r(n) including the data symbols 301 and the pilot symbols 302 (see FIG. 3) based on the input data. The phase noise component of each reception symbol estimated by the synthesis processing unit 109 is represented by $\theta^\pm(n)$.

The synthesis processing unit 109 calculates the estimated value $\theta^\pm(kN)$ of the phase noise component of the reception pilot symbol using the estimated value $\theta^+(kN)$ of the first phase noise component, the estimated value $\theta^-(kN)$ of the second phase noise component, and the phase difference $\varphi(kN)$. Further, the synthesis processing unit 109 calculates the estimated value $\theta^\pm(1+(k-1)N)$ of the phase noise component of the reception symbol corresponding to the data symbol 301 using the estimated value $\theta^+(kN)$ of the first phase noise component and the estimated value $\theta^-((k-1)N)$ of the second phase noise component, where l is an integer more than or equal to 1 and less than or equal to N-1.

Specifically, the synthesis processing unit 109 sequentially performs the calculation shown in the following equation to calculate the estimated value $\theta^\pm(kN)$ of the phase noise component of the reception pilot symbol.

$$\theta^\pm(kN) \leftarrow p_{4,N}(\theta^+(kN)+\theta^-(kN))+p_5\varphi(kN), k=M, M-1, \ldots, 1$$

Furthermore, the synthesis processing unit 109 sequentially performs the calculation shown in the following equation to calculate the estimated value $\theta^\pm(1+(k-1)N)$ of the phase noise component of the reception symbol corresponding to the data symbol 301 that is sandwiched between the two adjacent reception pilot symbols.

$$\theta^\pm(1+(k-1)N) \leftarrow p_{4,1}\theta^+(kN)+p_{4,N-1}\theta^-((k-1)N), 1=N-1, N-2, \ldots, 1$$

In this equation, $p_{4,1}$ to $p_{4,N}$ are coefficients stored in the ROM 196, and $p_5$ is a coefficient stored in the ROM 118. Like $p_1$ to $p_3$, $p_{4,1}$ to $p_{4,N}$ and $p_5$ are determined based on the phase noise spectrum, the pilot symbol interval N, the noise variance $\sigma_\theta^2$, and the like.

The synthesis processing unit 109 sequentially outputs the estimated values $\theta^\pm(MN)$, $\theta^\pm(MN-1)$, ..., and $\theta^\pm(1)$ of the phase noise components of the respective reception symbols. The LIFO memory 110 rearranges the order of the phase noise components output from the synthesis processing unit 109 and sequentially outputs the estimated values $\theta^\pm(1)$, $\theta^\pm(2)$, ..., and $\theta^\pm(MN)$ to the phase rotator 103. The phase rotator 103 rotates the phase of the reception symbol r(n) output from the FIFO memory 101 by the estimated value $\theta^\pm(n)$ of the phase noise component to compensate for the phase noise component, and outputs the reception symbol $r_c(n)$, the phase noise component of which is compensated. The compensated reception symbol $r_c(n)$ can be expressed by the following equation.

$$r_c(n)=r(n)e^{-j\theta^\pm(n)} \quad \text{[Equation 1]}$$

Next, a method of calculating each coefficient (a constant) stored in the ROM 114, 115, 118, and 196 will be described. Hereinafter, an example of a case where the phase noise spectrum of the local oscillator is modeled as shown in FIG. 4 will be described. As shown in FIG. 4, the phase noise spectrum is constant at a frequency less than or equal to $f_p(Hz)$ and at a frequency more than or equal to $f_z(Hz)$, and a section between $f_p(Hz)$ and $f_z(Hz)$ has a gradient of -20 dBc/Dec. The power spectrum density at a frequency 0(Hz) is $K_0$, and the transmission symbol rate is $f_s(Hz)$. The constants a1, b1, and K1 used to calculate the coefficients stored in the respective ROMs are defined by the following equations.

$$a_1 = \frac{f_s - \pi f_z}{f_s + \pi f_z}, \quad b_1 = \frac{f_s - \pi f_p}{f_s + \pi f_p}, \quad K_1 = K_0 f_s\left(\frac{1-b_1}{1-a_1}\right)^2 \quad \text{[Equation 2]}$$

In this equation, the circular constant is denoted by π. Using the above constants, different constants α and η are defined by the following equations.

$$\alpha = \frac{K_1(1-a_1b_1)(1-a_1b_1^{-1})}{1-b_1^2},$$ [Equation 3]

$$\eta = \frac{1+b_1^{2N}}{b_1^N} + \frac{\alpha}{K_1a_1b_1^{-1}+\sigma_w^2}\frac{1+b_1^{2N}}{b_1^N}$$

The coefficients $p_1$, $p_2$, $p_3$, $p_{4,l}$, and $p_5$ used for estimating the phase noise components are defined by the following equations respectively using the constants defined above.

$$p_1 = \frac{\eta}{2} - \sqrt{\left(\frac{\eta}{2}\right)^2 - 1}$$ [Equation 4]

$$p_2 = b_1^N - p_1$$ [Equation 5]

$$p_3 = \frac{p_2}{1 - p_1 b_1^N}$$ [Equation 6]

$$p_{4,l} = \frac{1-p_1b_1^N}{(1-p_1^2)b_1^N}\left[\frac{b_1^l(1-b_1^{2(N-l)})}{1-b_1^{2N}} + \frac{b_1^{N-l}(1-b_1^{2l})}{1-b_1^{2N}}p_1\right],$$ [Equation 7]

$$l = 1, 2, \ldots, N$$

$$p_5 = \frac{(1-p_1b_1^N)(1-p_1b_1^{-N})}{1-p_1^2}\frac{\sigma_w^2}{K_1a_1b_1^{-1}+\sigma_w^2} + \frac{K_1a_1b_1^{-1}}{K_1a_1b_1^{-1}+\sigma_w^2}$$ [Equation 8]

The inventor of the present disclosure has derived the coefficients defined by the above respective equations as the coefficient in which the mean square error of the estimation result of the phase noise component becomes minimum when the frequency spectrum of the phase noise of the local oscillator is the one shown in FIG. 4. The value of each coefficient does not have to be exactly the same as the value defined by the above equation as long as the mean square error of the estimation result of the phase noise component is within an allowable range, and may be an approximate value defined by the above equation. When the frequency spectrum of the phase noise of the local oscillator differs from that shown in FIG. 4, a value of the coefficient that can keep the mean square error of the estimation result of the phase noise component within the allowable range may be searched for, while repeatedly setting values of the respective coefficients and verifying them.

Figure 5:
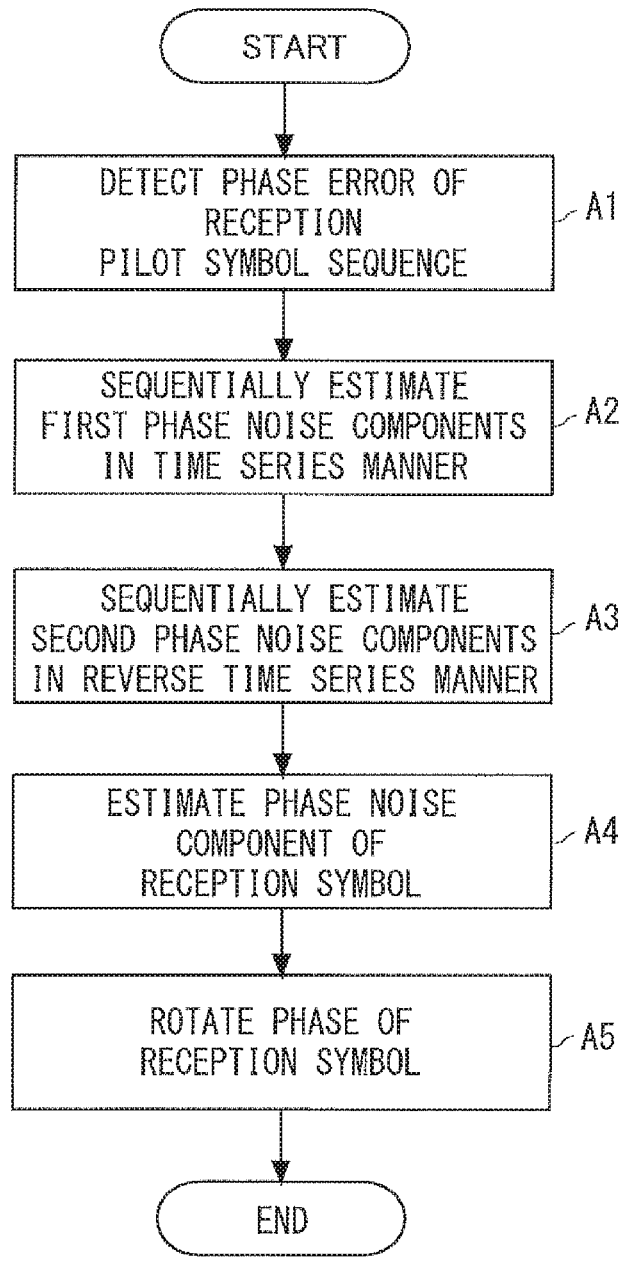
FIG. 5 is a flowchart showing an operation procedure of the phase noise compensation apparatus.

Next, an operation procedure of the phase noise compensation apparatus 100 will be described. FIG. 5 shows the operation procedure of the phase noise compensation apparatus 100. The FIFO memory 101 stores the reception symbols r(n) constituting the transmission frame 300 (see FIG. 3) that are sequentially input to the phase noise compensation apparatus 100. The reception pilot symbols corresponding to the pilot symbols 302 among the input reception symbols r(n) are sequentially input to the phase detector 104 through the switch 102. The phase detector 104 detects the phase error (the phase difference φ(kN)) of each reception pilot symbol (Step A1). The phase detector 104 sequentially outputs the M phase differences φ(kN) of the detected reception pilot symbols to the first IIR filter 106 and the LIFO memory 105 in the order along the time series. The LIFO memory 105 outputs the M phase differences φ(kN) of the reception pilot symbols to the second IIR filter 108 and the switch 117 in the reverse order to the input order.

The first IIR filter 106 sequentially estimates the first phase noise components θ⁺((k+1)N) of the reception pilot symbols using the phase differences φ(kN) of the reception pilots sequentially output by the phase detector 104 (Step A2). The first IIR filter 106 starts processing in a state where the initial value θ⁺(N) is stored in the register 164. The first IIR filter 106 calculates the estimated value θ⁺((k+1)N) of the first phase noise of the k+1th reception pilot symbol from the phase difference φ(kN) of the kth reception pilot symbol input along the time series and the estimated value θ⁺(kN) of the previous first phase noise component delayed by the register 164 and stores the estimated value θ⁺((k+1)N) in the register 164. In the processing of consecutive transmission frames, the initial value θ⁺(N) is given from a processing result of the previous transmission frame. In the case of the first frame having no preceding frame, a predetermined value, for example, 0 is given as the initial value θ⁺(N). The first IIR filter 106 outputs the estimated values θ⁺(N), θ+(2N), . . . , and θ+(MN) of the first phase noise components including the initial value θ⁺(N). The estimated value θ⁺((M+1)N) of the first phase noise component of the k+1th reception pilot symbol becomes the initial value of the next transmission frame and is used to calculate the initial value of the second IIR filter 108.

The phase differences φ(kN) of the reception pilots sequentially output by the phase detector 104 are input to the second IIR filter 108 through the LIFO memory 105 in a reverse time series manner. That is, the phase differences φ(MN), φ((M−1)N), . . . , and φ(N) are sequentially input to the second IIR filter 108. Although not shown in FIG. 2, the estimated value θ⁺((M+1)N) of the first phase noise component of the k+1th reception pilot symbol output from the first IIR filter 106 is also input to the second IIR filter 108, and the initial value determined based on the estimated value θ⁺((M+1)N) of the first phase noise component is stored in the register 184.

The second IIR filter 108 sequentially estimates the second phase noise components θ⁻((k−1)N) of the reception pilot symbols using the phase differences φ(kN) input in a reverse time series manner (Step A3). The second IIR filter 108 calculates the estimated value θ⁻((k−1)N) of the second phase noise of the k−1th reception pilot symbol from the phase difference φ(kN) of the kth reception pilot symbol input in a reverse time series manner and the estimated value θ⁻(kN) of the previous second phase noise component delayed by the register 184 and stores the estimated value θ⁻((k−1)N) in the register 184. The second IIR filter 108 outputs the estimated values θ⁻(MN), θ⁻((M−1)N), . . . , θ⁻(1), and θ⁻(0) including the initial value θ⁻(MN) of the second phase noise components.

The estimated value θ⁺(MN), θ⁺((M−1)N), . . . , and θ⁺(N) of the first phase noise components are sequentially input to the synthesis processing unit 109 through the LIFO memory 107, and the estimated values θ⁻(MN), θ⁻((M−1)N), . . . , θ⁻(1), and θ⁻(0) of the second phase noise components are sequentially input to the to the synthesis processing unit 109 through the LIFO memory 107. Further, the phase differences φ(MN), φ((M−1)N), . . . , and φ(N) of the reception pilot symbols are sequentially input to the synthesis processing unit 109 through the switch 117 and the multiplier 116. The synthesis processing unit 109 estimates the phase noise component of each reception symbol r(n) based on the phase difference of the reception pilot symbol input from the multiplier 116, the first phase noise component input from the first IIR filter 106, and the second phase noise component input from the second IIR filter 108 (Step A4).

In Step A4, the switch 117 is closed at the timing when the synthesis processing unit 109 calculates the estimated value θ$^{\pm}$(kN) of the phase noise component of the reception pilot symbol. In Step A4, when n is an integer multiple of N (n=kN), that is, when the reception symbol is a reception pilot symbol corresponding to the pilot symbol 302, the synthesis processing unit 109 calculates the estimated value θ$^{\pm}$(kN) of the phase noise component based on the first phase noise component θ$^{+}$(kN), the second phase noise component θ$^{-}$(kN), and the phase difference φ(kN) of the reception pilot symbol. When n is larger than (k−1)N and smaller than kN, i.e., ((k−1) N<n<kN), specifically, when the reception symbol is a symbol corresponding to the data symbol 301, the synthesis processing unit 109 calculates the estimated value θ$^{\pm}$(n) of the phase noise component based on the first phase noise component θ$^{+}$(kN) and the second phase noise component θ$^{-}$((k−1)N). The synthesis processing unit 109 sequentially calculates the estimated values θ$^{\pm}$(MN), θ$^{\pm}$(MN−1), θ$^{\pm}$(MN−2), . . . , and θ$^{\pm}$(1) of the phase noise components of the respective reception symbols and outputs them.

The phase noise component of each reception symbol estimated by the synthesis processing unit 109 is input to the phase rotator 103 through the LIFO memory 110. The phase rotator 103 rotates the phase of the reception symbol r(n) output from the FIFO memory 101 by the estimated phase noise component of each reception symbol (Step A5). The phase noise component included in each reception symbol can be removed by rotating the phase of the reception symbol r(n) by the estimated phase noise component.

In the present embodiment, the phase noise compensation apparatus 100 includes the first IIR filter 106 and the second IIR filter 108 that estimate the phase noise components of the reception pilot symbols. The first IIR filter 106 refers to the phase errors of the reception pilot symbols in a time series manner, whereas the second IIR filter 108 refers to the phase errors of the reception pilot symbols in a reverse time series manner. It is known that there is time correlation in phase noise. When estimation results of two phase noise components obtained using time correlation in two time directions are used for estimating the phase noise component of the reception symbol, the estimation accuracy of the phase noise component is expected to improve more than when only one estimation result is used. The phase noise compensation apparatus 100 according to the present embodiment can compensate phase noise with high accuracy, and when used in a multilevel QAM transmission scheme having a large number of transmission multilevels, it is possible to achieve data communication with a large capacity and high quality.

Figure 10:
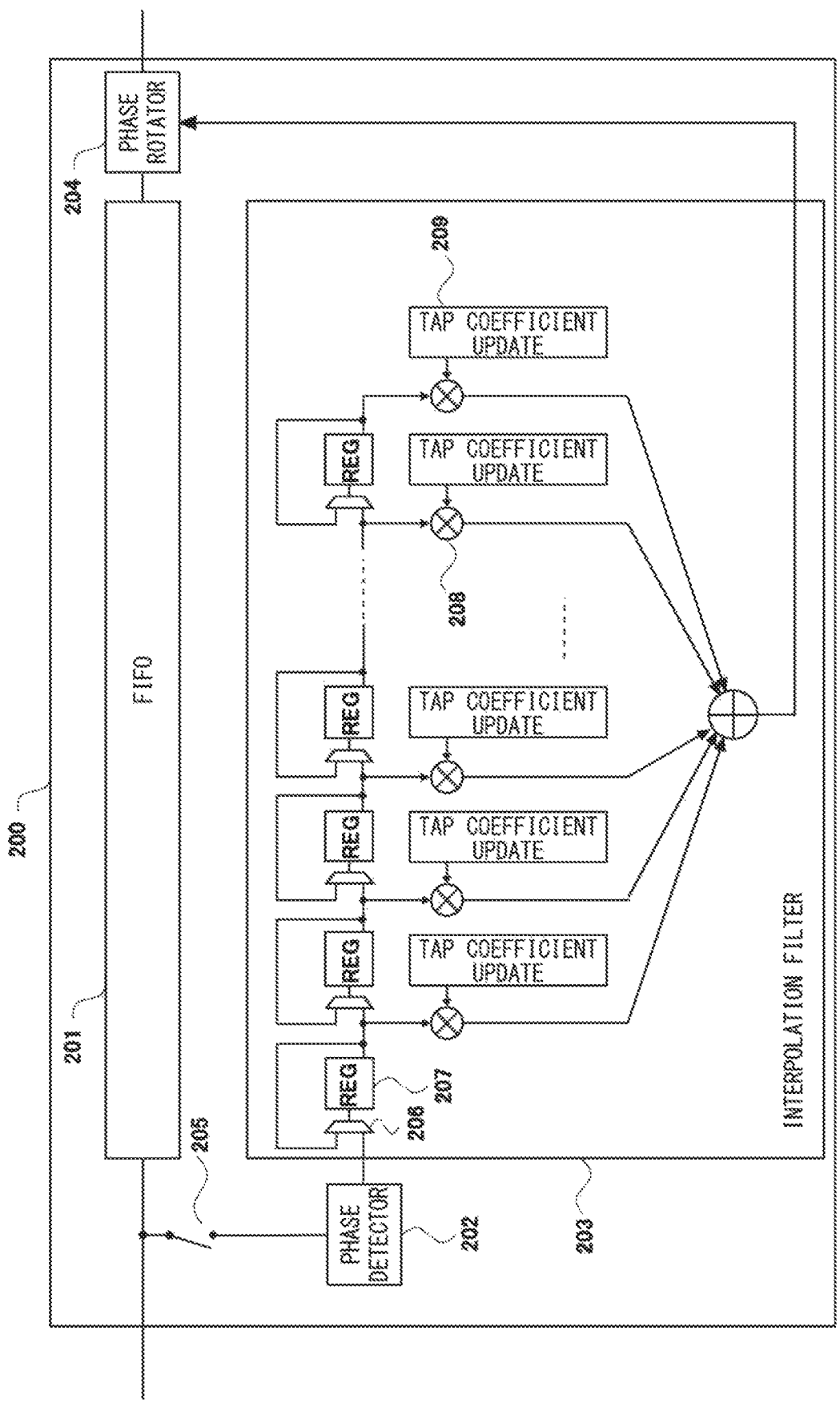
FIG. 10 is a block diagram showing a phase noise compensation apparatus according to related art.

In the present embodiment, the first IIR filter 106 and the second IIR filter 108 are used for estimating the phase noise components of the respective reception pilot symbols. In the phase noise compensation apparatus 200 (see FIG. 10) according to the related art using the pilot symbol and the interpolation filter, it is necessary to increase the number of taps of the interpolation filter 203 in order to improve the compensation accuracy. In the phase noise compensation apparatus 200 according to the related art, the increase in the number of taps causes the apparatus size and the calculation amount to increase. In the present embodiment, each of the first IIR filter 106 and the second IIR filter 108 is configured as the IIR filter having two taps, and thus they can estimate the phase noise component with less number of taps as compared with the phase noise compensation apparatus 200 according to the related art. Therefore, the phase noise compensation apparatus 100 according to the present embodiment can achieve highly accurate phase compensation with a smaller apparatus size and calculation amount as compared with the phase noise compensation apparatus 200 according to the related art.

An effect of the phase noise compensation apparatus according to the above embodiment will be described with reference to numerical examples. The inventor carried out a simulation and obtained a mean square error that remains after the phase noise is compensated for each of the phase noise compensation apparatus 100 according to the above embodiment and the phase noise compensation apparatus 200 according to the related art shown in FIG. 10. In the simulation, the parameters $f_p$, $f_z$, and $K_0$ in the phase noise spectrum of the local oscillator shown in FIG. 4 were set such that $f_p$=100 Hz, $f_z$=5 MHz, and $K_0$=−35 dBc/Hz, and the symbol rate was set to $f_s$=24 MHz. Further, the pilot signal interval was set to N=50 symbols, and one transmission frame was set to MN=500 symbols. The modulation scheme was 256 QAM scheme. In the phase noise compensation apparatus 200 according to the related art, the number of taps of the interpolation filter 203 was set to 11.

Figure 6:
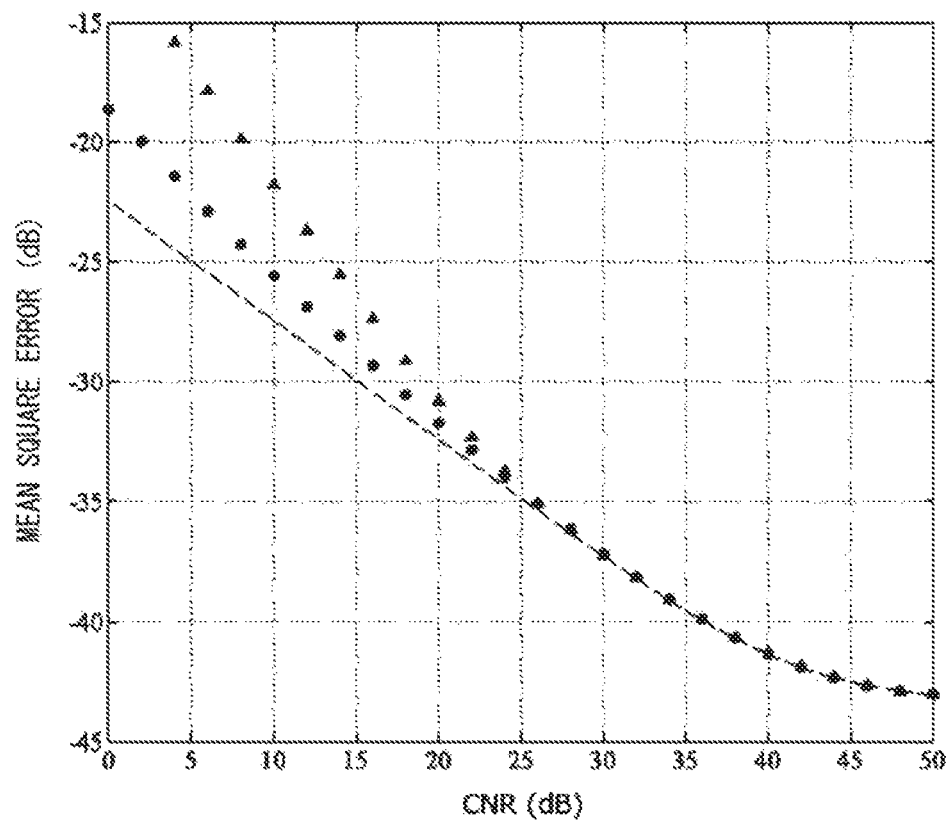
FIG. 6 is a graph showing a relationship between a mean square error and a carrier-to-noise power ratio of a transmission path.

The results of the simulation are shown in FIG. 6. In the graph shown in FIG. 6, the horizontal axis represents a carrier-to-noise power ratio (CNR) caused by thermal noise, and the vertical axis represents the mean square error with respect to the remaining phase noise in decibels. In FIG. 6, the mean square error of the phase noise compensation apparatus 100 according to the present embodiment is plotted with circular symbols, and the mean square error of the phase noise compensation apparatus 200 according to the related art is plotted with triangular symbols. The broken line shown in FIG. 6 shows a lower limit value of the mean square error.

Referring to FIG. 6, when the carrier-to-noise power ratio is relatively large, for example, when the CNR is equal to or greater than 30 dB, the mean square error almost reaches the lower limit value both in the phase noise compensation apparatus 100 according to the present embodiment and in the phase noise compensation apparatus 200 according to the related art. On the other hand, when the carrier-to-noise power ratio is small, the mean square error in the phase noise compensation apparatus 100 according to the present embodiment exhibits a characteristic better than that of the phase noise compensation apparatus 200 according to the related art by a few dB, even though it deviates from the lower limit value.

Furthermore, the number of multipliers necessary for the filter in the phase noise compensation apparatus 100 according to the present embodiment is about ⅓ of that of the phase noise compensation apparatus 200 according to the related art. Considering the case in which the phase noise compensation apparatus is implemented as an IC (Integrated Circuit) etc., it is preferable that the number of multipliers be small, because the multiplier has a particularly large influence on the apparatus size. The phase noise compensation apparatus 100 according to the present embodiment can reduce the number of the multipliers and the apparatus size as compared with the phase noise compensation apparatus 200 according to the related art.

Moreover, when comparing the calculation amount required for deriving the phase noise estimated value necessary for one symbol in the phase noise compensation apparatus 100 according to the present embodiment with that in the phase noise compensation apparatus 200 according to the related art, the calculation amount in the phase noise compensation apparatus 100 according to the present embodiment is about ¼ of that in the phase noise compensation apparatus 200 according to the related art. As described above, it has been confirmed that the phase noise compensation apparatus 100 according to the present embodiment is capable of compensating the phase noise with high accuracy while reducing the apparatus size and the calculation amount as compared with the phase noise compensation apparatus according to the related art.

Figure 7:
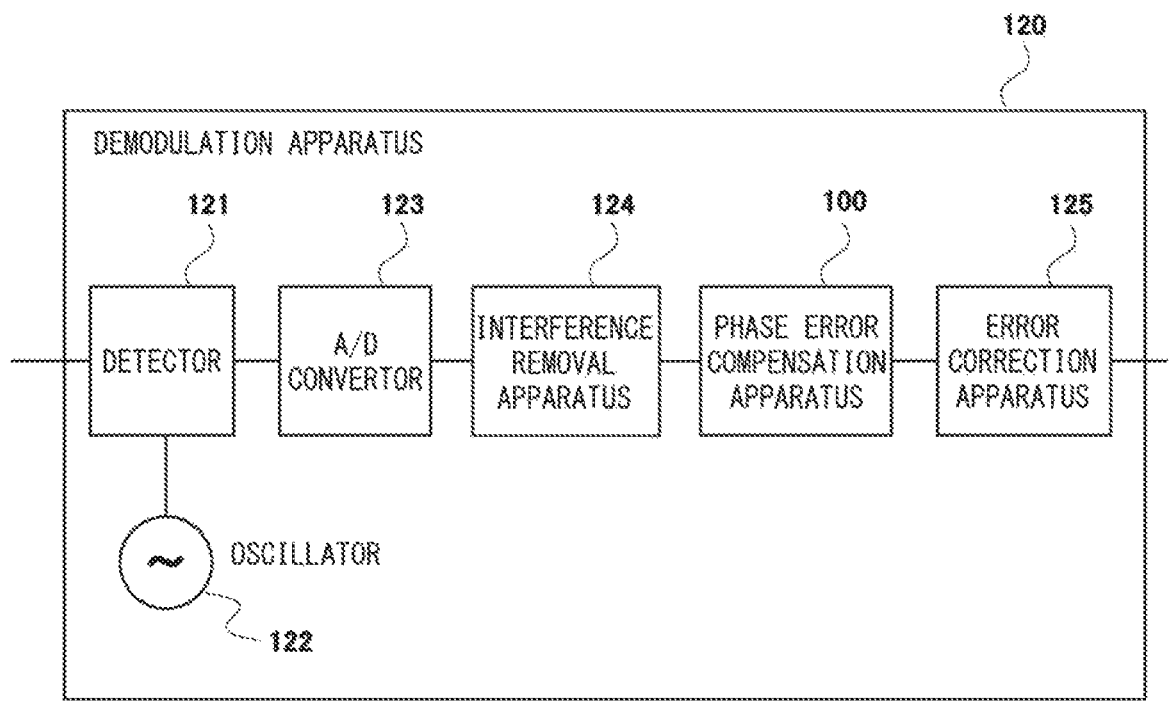
FIG. 7 is a block diagram showing a demodulation apparatus.

Next, a demodulation apparatus including the phase noise compensation apparatus 100 will be described. FIG. 7 shows the demodulation apparatus including the phase noise compensation apparatus 100. A demodulation apparatus 120 includes the phase noise compensation apparatus 100, a detector 121, an oscillator 122, an A/D convertor (analog to digital convertor) 123, an interference removal apparatus 124, and an error correction apparatus 125. The detector 121 detects a signal modulated by a modulation scheme that uses the phase information for data identification using a signal of a predetermined frequency output by the oscillator 122 that is a local oscillator. The A/D convertor 123 converts the detection signal output by the detector 121 from an analog signal to a digital signal.

The interference removal apparatus 124 removes an interference component from the detection signal output from the A/D convertor 123. As described in the above embodiment, the phase noise compensation apparatus 100 estimates the first phase noise component and the second phase noise component of each reception pilot symbol, estimates the phase noise component of each reception symbol using these phase noise components and the phase error of each reception pilot symbol, and compensates the phase noise component of each reception symbol. The error correction apparatus 125 performs predetermined error correction processing on the signal in which the phase noise component is compensated. The error correction apparatus 125 outputs a demodulated signal obtained by demodulating the signal modulated on the transmission side.

Figure 8:
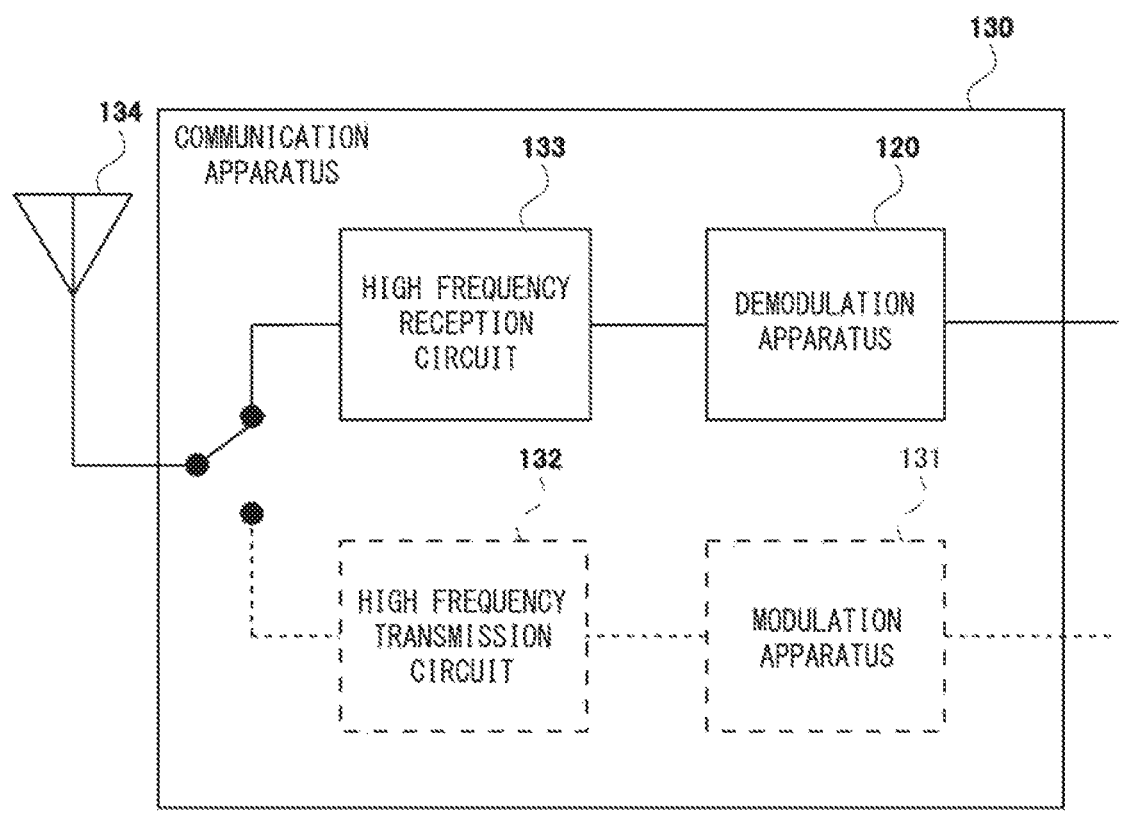
FIG. 8 is a block diagram showing a communication apparatus.

Next, a communication apparatus including the demodulation apparatus 120 will be described. FIG. 8 shows a communication apparatus 130 including the demodulation apparatus 120. The communication apparatus 130 includes the demodulation apparatus 120, a modulation apparatus 131, a high frequency transmission circuit 132, a high frequency reception circuit 133, and an antenna 134. The communication apparatus 130 is configured as a digital wireless communication apparatus that, for example, transmits and receives radio signals having frequencies in a microwave band or a millimeter wave band. The communication apparatus 130 may be configured as an optical communication apparatus that transmits and receives optical signals by, for example, the WDM (Wavelength Division Multiplexing) scheme.

The modulation apparatus 131 modulates transmission data input from a signal processing circuit (not shown) by a modulation scheme that uses phase information for data identification. The high frequency transmission circuit 132 transmits the signal modulated by the modulation apparatus 131 to another communication apparatus 130 through the antenna 134. The high frequency reception circuit 133 receives the signal transmitted from the other communication apparatus 130 through the antenna 134. The demodulation apparatus 120 demodulates the data modulated on the transmission side from the signal received by the high frequency reception circuit 133. The demodulation apparatus 120 outputs the demodulated data to a signal processing circuit (not shown) etc. In the demodulation apparatus 120, the phase noise component can be compensated with high accuracy, and thus the data modulated on the transmission side can be demodulated with high accuracy.

Figure 9:
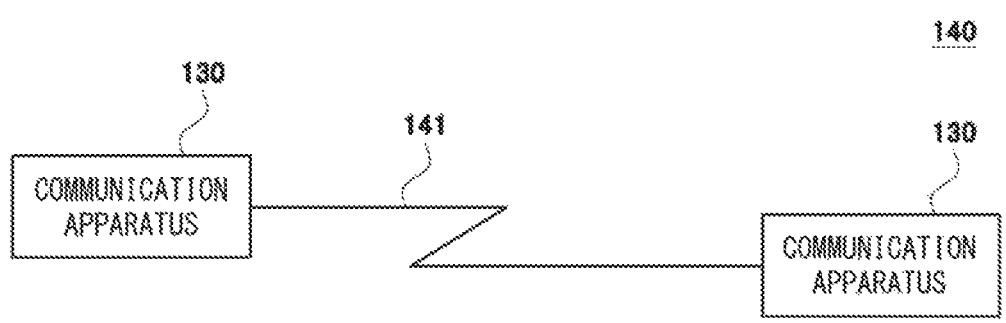
FIG. 9 is a block diagram showing a communication system.

FIG. 9 shows a communication system including the communication apparatus 130. A communication system 140 includes two communication apparatuses 130 connected to each other through a transmission path 141. The transmission path 141 may be a wireless transmission path or a wired transmission path. The wired transmission path includes, for example, an electric communication line that performs signal transmission using an electric signal and an optical communication line that performs signal transmission using an optical signal. The communication system 140 is not limited to the one in which the two communication apparatuses 130 are connected to each other through the transmission path 141 and instead may have a configuration in which a plurality of the communication apparatuses 130 are connected to one another through a network. Highly reliable data transmission can be achieved in the communication system 140, because the communication apparatus 130 can modulate the data modulated on the transmission side with high accuracy.

It should be noted that, although the example in which the communication apparatus 130 includes the demodulation apparatus 120 and the high frequency reception circuit 133, and the modulation apparatus 131 and the high frequency transmission circuit 132 has been described with reference to FIG. 8, the present disclosure is not limited to this. For example, when the data transmission in the communication system 140 shown in FIG. 9 only needs to be one way from one communication apparatus 130 to the other communication apparatus 130, the communication apparatus 130 may include only a circuit necessary for transmission or reception. For example, the communication apparatus 130 on the transmission side may include the modulation apparatus 131 and the high frequency transmission circuit 132, and the communication apparatus 130 on the reception side may include the demodulation apparatus 120 and the high frequency reception circuit 133.

Although the present disclosure has been described with reference to the embodiment, the present disclosure is not limited by the above description. Various changes that can be understood by those skilled in the art within the scope of the disclosure can be made to the components and details of the present disclosure.

For example, the whole or part of the embodiments disclosed above can be described as, but not limited to, the following supplementary notes.

[Supplementary Note 1]

A phase noise compensation apparatus used for a demodulation apparatus for demodulating a transmission signal modulated by a modulation scheme that uses phase information for data identification, the phase noise compensation apparatus comprising:

a phase detector configured to section reception symbols including a reception data symbol and a reception pilot symbol included in the transmission signal into a block of a predetermined number of symbols and detect a phase error of a reception pilot symbol sequence obtained by extracting the reception pilot symbols included in the sectioned reception symbol sequence;

a first filter including an infinite impulse response filter and configured to refer to the phase error in order in a time series manner and sequentially estimate a first phase noise component of the reception pilot symbol;

a second filter including an infinite impulse response filter and configured to refer to the phase error in order in a reverse time series manner and sequentially estimate a second phase noise component of the reception pilot symbol;

synthesis processing means configured to estimate a phase noise component of the reception symbol included in the reception symbol sequence based on the first phase noise component, the second phase noise component, and the phase error; and a phase rotator configured to rotate a phase of the reception symbol based on the estimated phase noise component of the reception symbol.

[Supplementary Note 2]

The phase noise compensation apparatus according to Supplementary note 1, wherein each of the infinite impulse response filter included in the first filter and the infinite impulse response filter included in the second filter includes one delay element.

[Supplementary Note 3]

The phase noise compensation apparatus according to Supplementary note 1 or 2, wherein the synthesis processing means comprises an adder configured to weight and add the first phase noise component and the second phase noise component.

[Supplementary Note 4]

The phase noise compensation apparatus according to Supplementary note 3, wherein the adder further weights and adds the phase error.

[Supplementary Note 5]

The phase noise compensation apparatus according to Supplementary note 3 or 4, wherein the adder performs weighting and adding with weights determined based on a phase noise spectrum of a local oscillator used to demodulate the transmission signal.

[Supplementary Note 6]

The phase noise compensation apparatus according to any one of Supplementary notes 1 to 5, wherein in the second filter, an initial value of the infinite impulse response filter is set based on the first phase noise component estimated by the first filter.

[Supplementary Note 7]

The phase noise compensation apparatus according to any one of Supplementary notes 1 to 6, wherein the synthesis processing means estimates the phase noise component of the reception data symbol included in the reception symbol sequence based on the first phase noise component and the second phase noise component.

[Supplementary Note 8]

The phase noise compensation apparatus according to any one of Supplementary notes 1 to 7, wherein the synthesis processing means estimates the phase noise component of the reception pilot symbol included in the reception symbol sequence based on the first phase noise component, the second phase noise component, and the phase error.

[Supplementary Note 9]

The phase noise compensation apparatus according to any one of Supplementary notes 1 to 8, wherein the synthesis processing means estimates the phase noise component of each reception data symbol included between a k−1th reception pilot symbol and a kth reception pilot symbol based on the first phase noise component of the kth reception pilot symbol and the second phase noise component of the k−1th reception pilot symbol, when the reception pilot symbol sequence includes M reception pilot symbols, where M is a positive integer, and k is a positive integer of more than or equal to 1 and less than or equal to M.

[Supplementary Note 10]

The phase noise compensation apparatus according to Supplementary note 9, wherein the synthesis processing means estimates the phase noise component of the kth reception pilot symbol based on the first phase noise component of the kth reception pilot symbol, the second phase noise component of the kth reception pilot symbol, and the phase error of the kth reception pilot symbol.

[Supplementary Note 11]

A demodulation apparatus comprising:

the phase noise compensation apparatus according to any one of Supplementary notes 1 to 10;

a local oscillator configured to output a signal having a predetermined frequency; and a detector configured to detect the transmission signal using the signal output from the local oscillator and output it to the phase noise compensation apparatus.

[Supplementary Note 12]

A reception apparatus comprising:

the demodulation apparatus according to Supplementary note 11; and a reception circuit configured to receive the transmission signal and supply it to the demodulation apparatus.

[Supplementary Note 13]

A communication system comprising:

the reception apparatus according to Supplementary note 12;

a modulation apparatus configured to modulate transmission data and output a modulated signal to the reception apparatus; and a transmission apparatus including a transmission circuit configured to transmit the modulated signal to the reception apparatus.

[Supplementary Note 14]

A phase noise compensation method comprising:

sectioning a reception symbol sequence including a data symbol and a pilot symbol included in a transmission signal modulated by a modulation scheme that uses phase information for data identification into a block of a predetermined number of symbols and detecting a phase error of a reception pilot symbol sequence obtained by extracting the reception pilot symbols included in the sectioned reception symbol sequence;

referring to the phase error in order in a time series manner and sequentially estimating a first phase noise component of the reception pilot symbol using an infinite impulse response filter;

referring to the phase error in order in a reverse time series manner and sequentially estimating a second phase noise component of the reception pilot symbol using an infinite impulse response filter;

estimating a phase noise component of a reception symbol included in the reception symbol sequence based on the first phase noise component, the second phase noise component, and the phase error; and rotating a phase of the reception symbol based on the estimated phase noise component of the reception symbol.

The present application is based upon and claims the benefit of priority from Japanese Patent Application No. 2016-160081, filed on Aug. 17, 2016, the entire contents of which are hereby incorporated by reference.

REFERENCE SIGNS LIST

10: PHASE NOISE COMPENSATION APPARATUS
11: PHASE DETECTOR
12, 13: FILTER
14: SYNTHESIS PROCESSING UNIT
15: PHASE ROTATOR
100: PHASE NOISE COMPENSATION APPARATUS

101: FIFO MEMORY
102, 117: SWITCH
103: PHASE ROTATOR
104: PHASE DETECTOR
105, 107, 110: LIFO MEMORY
106, 108: INFINITE IMPULSE RESPONSE FILTER (IIR FILTER)
109: SYNTHESIS PROCESSING UNIT
161, 162, 181, 182: MULTIPLIER
163, 183: ADDER
164, 184: REGISTER
114, 115, 118, 196: ROM
200: PHASE NOISE COMPENSATION APPARATUS
201: FIFO MEMORY
205: SWITCH
204: PHASE ROTATOR
202: PHASE DETECTOR
203: INTERPOLATION FILTER
206: SELECTOR
209: TAP COEFFICIENT UPDATE APPARATUS
300: TRANSMISSION FRAME
301: DATA SYMBOL
302: PILOT SYMBOL

The invention claimed is:

1. A phase noise compensation apparatus used for a demodulation apparatus, the demodulation apparatus demodulating a transmission signal which is modulated using a modulation scheme that uses phase information for data identification, the phase noise compensation apparatus comprising:
a phase detector configured to section reception symbols including a reception data symbol and a reception pilot symbol included in the transmission signal into a block of a predetermined number of symbols and detect a phase error of a reception pilot symbol sequence obtained by extracting the reception pilot symbols included in the sectioned reception symbol sequence;
a first filter including an infinite impulse response filter and configured to refer to the phase error in a forward direction in time and sequentially estimate a first phase noise component of the reception pilot symbol;
a second filter including an infinite impulse response filter and configured to refer to the phase error in a backward direction in time and sequentially estimate a second phase noise component of the reception pilot symbol;
synthesis processing unit configured to estimate a phase noise component of the reception symbol included in the reception symbol sequence based on the first phase noise component, the second phase noise component, and the phase error; and
a phase rotator configured to rotate a phase of the reception symbol based on the estimated phase noise component of the reception symbol
wherein the synthesis processing unit estimates the phase noise component of each reception data symbol included between a k−1th reception pilot symbol and a kth reception pilot symbol based on the first phase noise component of the kth reception pilot symbol and the second phase noise component of the k−1th reception pilot symbol, when the reception pilot symbol sequence includes M reception pilot symbols, where M is a positive integer, and k is a positive integer of more than or equal to 1 and less than or equal to M.

2. The phase noise compensation apparatus according to claim 1, wherein each of the infinite impulse response filter included in the first filter and the infinite impulse response filter included in the second filter includes one delay element.

3. The phase noise compensation apparatus according to claim 1, wherein the synthesis processing unit comprises an adder configured to weight and add the first phase noise component and the second phase noise component.

4. The phase noise compensation apparatus according to claim 3, wherein the adder further weights and adds the phase error.

5. The phase noise compensation apparatus according to claim 3, wherein the adder performs weighting and adding with weights determined based on a phase noise spectrum of a local oscillator used to demodulate the transmission signal.

6. The phase noise compensation apparatus according to claim 1, wherein in the second filter, an initial value of the infinite impulse response filter is set based on the first phase noise component estimated by the first filter.

7. The phase noise compensation apparatus according to claim 1, wherein the synthesis processing unit estimates the phase noise component of the reception data symbol included in the reception symbol sequence based on the first phase noise component and the second phase noise component.

8. The phase noise compensation apparatus according to claim 1, wherein the synthesis processing unit estimates the phase noise component of the reception pilot symbol included in the reception symbol sequence based on the first phase noise component, the second phase noise component, and the phase error.

9. The phase noise compensation apparatus according to claim 1, wherein the synthesis processing unit estimates the phase noise component of the kth reception pilot symbol based on the first phase noise component of the kth reception pilot symbol, the second phase noise component of the kth reception pilot symbol, and the phase error of the kth reception pilot symbol.

10. A demodulation apparatus comprising:
the phase noise compensation apparatus according to claim 1;
a local oscillator configured to output a signal having a predetermined frequency; and
a detector configured to detect the transmission signal using the signal output from the local oscillator and output it to the phase noise compensation apparatus.

11. A phase noise compensation method comprising:
sectioning a reception symbol sequence including a data symbol and a pilot symbol included in a transmission signal modulated by a modulation scheme that uses phase information for data identification into a block of a predetermined number of symbols and detecting a phase error of a reception pilot symbol sequence obtained by extracting the reception pilot symbols included in the sectioned reception symbol sequence;
referring to the phase error in a forward direction in time and sequentially estimating a first phase noise component of the reception pilot symbol using an infinite impulse response filter;
referring to the phase error in a backward direction in time and sequentially estimating a second phase noise component of the reception pilot symbol using an infinite impulse response filter;
estimating a phase noise component of a reception symbol included in the reception symbol sequence based on the first phase noise component, the second phase noise component, and the phase error; and rotating a phase of the reception symbol based on the estimated phase noise component of the reception symbol wherein the phase noise component of each reception data symbol included between a k−1th reception pilot symbol and a kth reception pilot symbol is estimated based on the first phase noise component of the kth reception pilot symbol and the second phase noise component of the k−1th reception pilot symbol, when the reception pilot symbol sequence includes M reception pilot symbols, where M is a positive integer, and k is a positive integer of more than or equal to 1 and less than or equal to M.

* * * * *